United States Patent [19]

Sakurai et al.

[11] Patent Number: 5,281,510
[45] Date of Patent: Jan. 25, 1994

[54] PHOTOSENSITIVE ELASTOMERIC COMPOSITION

[75] Inventors: Fusayoshi Sakurai, Yokosuka; Hiroto Kidokoro, Tokyo; Mitsuhiro Tamura, Sagamihara, all of Japan

[73] Assignee: Nippon Zeon Co., Ltd., Tokyo, Japan

[21] Appl. No.: 64,482

[22] Filed: Dec. 30, 1992

Related U.S. Application Data

[63] Continuation of Ser. No. 323,135, Mar. 13, 1989, abandoned, which is a continuation of Ser. No. 84,843, Aug. 13, 1987, abandoned.

[30] Foreign Application Priority Data

Aug. 18, 1986 [JP] Japan ............................ 61-192518
Sep. 11, 1986 [JP] Japan ............................ 61-214842

[51] Int. Cl.$^5$ ...................... G03F 7/033; C08F 279/02
[52] U.S. Cl. ............................................. 430/283; 430/286; 430/287; 430/907; 522/114; 522/117; 522/121
[58] Field of Search ............... 430/283, 286, 287, 907; 522/114, 117, 121

[56] References Cited

U.S. PATENT DOCUMENTS

| | | | |
|---|---|---|---|
| 3,937,659 | 2/1976 | Boldt | 522/121 |
| 4,027,063 | 5/1977 | Fujiwara | 522/96 |
| 4,033,840 | 7/1977 | Fujiwara | 522/149 |
| 4,045,231 | 8/1977 | Toda | 522/121 |
| 4,174,218 | 11/1979 | Pohl | 522/103 |
| 4,320,188 | 3/1982 | Heinz | 522/121 |

FOREIGN PATENT DOCUMENTS 0044166 1/1982 European Pat. Off. .
0162570 11/1985 European Pat. Off. .

*Primary Examiner*—David Buttner
*Attorney, Agent, or Firm*—Sherman and Shalloway

[57] ABSTRACT

A photosensitive elastomeric composition comprising (1) at least one elastomer, (2) an addition-polymerizable compound having at least one $CH_2=C<$ group and (3) a polymerization initiator activatable by actinic light, wherein the elastomer (1) is an elastomer selected from (a) an elastomeric polymer composed of a polyene monomer containing at least two non-conjugated double bonds and a conjugated diene-type monomer or both a conjugated diene-type monomer and a copolymerizable vinyl monomer and (b) an elastomeric linear A-B type (wherein A represents a polymer block of a monovinyl aromatic compound and B represents a polymer block of a conjugated diene-type monomer) block copolymer in which a terminal group having a polymerizable ethylenic double bond is present in at least one end of the molecular chain.

15 Claims, No Drawings

PHOTOSENSITIVE ELASTOMERIC COMPOSITION

This application is a continuation of application Ser. No. 07/323,135, filed Mar. 13, 1989, which is a continuation of application Ser. No. 07/084,843, filed Aug. 13, 1987, both now abandoned.

This invention relates to a photosensitive elastomeric composition.

In the prior art, a rubber plate used in flexographic printing is produced by direct engraving on a rubber plate; or by a method comprising first producing an original engraved plate by etching of a metallic plate, producing a matrix of plastics utilizing the original engraved plate, and pouring rubber into the matrix plate and vulcanizing it. These methods, however, are complex and require expertise. Since they consist of many steps, they are expensive and time-consuming. Furthermore, since the resulting rubber plates have low precision, they require after-processing such as planing prior to use.

To remove this defect, a method was recently proposed in which a flexographic printing plate is produced directly from a photosensitive elastomeric composition. For example, U.S. Pat. No. 4,323,636 shows that it is effective to use a solvent-soluble thermoplastic elastomeric block copolymer of the A-B-A structure consisting of at least two thermoplastic non-elastomeric polymeric blocks (A) having a glass transition temperature of at least 25° C. and an elastomeric block (B) having a glass transition temperature of not more than 10° C. bonding the two non-elastomeric polymer blocks (A). A flexographic printing plate obtained by molding a photosensitive composition comprising this block copolymer exposing the molded product to actinic light has insufficient rubbery elasticity as compared with the conventional vulcanized rubber plate. Furthermore, in the development step (washing of the unexposed area with a solvent) in the preparation of a printing plate, the plate is swollen with the solvent and the reproduction of an image is not entirely satisfactory. Japanese Patent Publication No. 37762/1978 proposes the use of a combination of at least one elastomeric polymer selected from unvulcanized polybutadiene rubber, chloroprene rubber and acrylonitrile/butadiene rubber and at least one liquid prepolymer having a molecular weight of 1,000 to 5,000 selected from polybutadiene, butadiene/styrene copolymer, butadiene/acrylonitrile copolymers and derivatives of these. This method brings about some degree of improvement in regard to elasticity, but has the defect that the processability of a composition comprising these polymers is poor, and in particular, a sheet molded from it has inferior smoothness and shrinkage. This defects precludes the use of these polymers in practical applications.

It is an object of this invention to overcome the defects of conventional photosensitive elastomeric compositions for flexographic printing and to provide a novel photosensitive elastomeric composition capable of giving a flexographic printing plate which permits application of a clear print by a simple operation to a material to be printed.

According to this invention there is provided a photosensitive elastomeric composition comprising (1) at least one elastomer, (2) an addition-polymerizable compound having at least one $CH_2=C<$ group and (3) a polymerization initiator activatable by actinic light, wherein the elastomer (1) is an elastomer selected from (a) an elastomeric polymer composed of a polyene monomer containing at least two non-conjugated double bonds and a conjugated diene-type monomer or both a conjugated diene-type monomer and a copolymerizable vinyl monomer and (b) an elastomeric linear A-B type (wherein A represents a polymer block of a monovinyl aromatic compound and B represents a polymer block of a conjugated diene-type monomer) block copolymer in which a terminal group having a polymerizable ethylenic double bond is present in at least one end of the molecular chain.

The photosensitive elastomeric composition of this invention has excellent moldability and gives a very smooth sheet. It also has the advantage of possessing excellent rubbery elasticity and permitting formation of a relief image of excellent resolution.

The elastomer (a) used in the invention is an elastomeric copolymer of a conjugated diene-type monomer and a polyene monomer having at least two non-conjugated double bonds, or an elastomeric copolymer of a conjugated diene-type monomer, a polyene monomer having at least two non-conjugated double bonds and a vinyl monomer copolymerizable with these monomers. The monomer constituting the skeleton of these elastomeric copolymers includes, for example, conjugated diene-type monomers such as 1,3-butadiene, isoprene, 2,3-dimethylbutadiene, 1,3-pentadiene and chloroprene; and vinyl monomers such as aromatic vinyl monomers such as styrene and alpha-methylstyrene, unsaturated nitrile monomers such as acrylonitrile, methacrylonitrile and alpha-chloroacrylonitrile. The vinyl monomers are not limited to these specific examples, and may be any of conjugated diene-type monomers and vinyl monomers copolymerizable with polyene monomers shown below.

In the copolymer of a conjugated diene and a vinyl monomer copolymerizable with it, the ratio of the two monomers is not particularly limited so long as the resulting copolymer is elastomeric at room temperature. When a monomer which gives a homopolymer being resinous at room temperature is used as the vinyl monomer, the content of the units derived from this vinyl monomer is preferably not more than 60% by weight.

In addition to the above monomers, the polyene monomer is essential in forming the elastomeric polymer used in the invention.

The polyene monomer is a monomer which undergoes a crosslinking reaction during the copolymerization reaction. It serves to impart excellent sheet-forming properties and excellent resolution of relief images to the photosensitive composition of this invention comprising the conjugated diene-type elastomer. Examples of the polyene monomer include divinylbenzene, divinyl sulfide, divinylsulfone, divinyl oxalate, N,N'-methylenebisacrylamide, allyl acrylate, allyl methacrylate, vinyl acrylate, vinyl methacrylate, allyl vinyl ether, allyl acrylamide, allyl methacrylamide, diallyl acrylamide, diallyl ether, diallyl oxalate, diallyl malonate, diallyl adipate, trimethylolpropane triallyl ether, ethylene glycol diacrylate, ethylene glycol dimethacrylate, polyethylene glycol diacrylate, propylene glycol diacrylate, bisphenol dimethacrylate and trimethylolpropane trimethacrylate. Usually, at least one of these polyene monomers is used in a proportion of about 0.05 to 5.0% by weight based on the weight of the conjugated diene-type monomer or the conjugated diene-type monomer and the vinyl monomer copolymerizable therewith. If this proportion is less than about 0.05% by weight, the sheet-forming properties of the elastomeric polymer in accordance with this invention are not improved. If it exceeds 5% by weight, the polymer becomes brittle and has poor processability. Moreover, it has reduced washability of unexposed portions after exposure. The preferred proportion of the polyene monomer is 0.1 to 3% by weight.

The method of producing the conjugated diene-type elastomer used in this invention is not particularly limited, and radical polymerizations in an aqueous medium, such as emulsion polymerization and suspension polymerization, may be cited as particularly preferred methods. The polymerization reaction in an aqueous medium may be carried out by using inorganic or organic peroxides, inorganic persulfates, organic hydroperoxides, organic azo compounds, redox-type catalysts, an emulsifier, a dispersant, and optionally a molecular weight regulating agent. The polymerization temperature may be low to high. After the polymerization, the product is worked up in a customary manner. It is coagulated or filtered, washed and dried to give the desired polymer.

The elastomer (b) used in this invention, i.e. the elastomeric linear A-B type block copolymer, is an elastomeric block copolymer in which a terminal group containing a radical polymerizable ethylenic double bond is present in at least one end of the copolymer chain.

Block A is a polymer block of a monovinyl aromatic compound such as styrene or alpha-methylstyrene. It is a thermoplastic non-elastomeric polymer block having a glass transition temperature of at least 25° C. which includes a polymer of at least one monovinyl aromatic compound and a copolymer of it with a copolymerizable monomer. A polystyrene block is particularly preferred.

Block B is a polymer block of a conjugated diene-type monomer such as 1,3-butadiene, isoprene, 1,3-pentadiene or chloroprene. It is an elastomeric polymer block having a glass transition temperature of not more than 10° C. which includes a polymer of at least one conjugated diene-type monomer or a copolymer of this monomer with a monomer copolymerizable with it. A polybutadiene block and a polyisoprene block are especially preferred.

The A-B type block copolymer used in this invention is a linear copolymer in which about 1 to 10, preferably 1 to 3, (A-B) units recur in the molecular chain. There is no particular restriction on the proportions of blocks A and blocks B if the resulting block copolymer is elastomeric. The preferred proportion of blocks B in the entire blocks is 60 to 90% by weight. The blocks A usually have a weight average molecular weight, determined by GPC, of 2,000 to 100,000. The blocks B usually have a weight average molecular weight of 10,000 to 1,000,000.

The block copolymer used in this invention is characterized further by the fact that a terminal group having a radical-polymerizable ethylenic double bond is present in at least one end of the block copolymer chain.

The block copolymer used in this invention may be produced by an ordinary anionic polymerization method. One example is disclosed in U.S. Pat. No. 3,786,116. The method disclosed in this patent comprises preparing a living block copolymer of polystyrene-polyisoprene by consecutive polymerization, adding ethylene oxide or propylene oxide to form a block copolymer having stable anionic terminal groups, and thereafter reacting it with a methacryloyl halide to produce a block copolymer in which a terminal group having a radical-polymerizable double bond is present at a terminal of the polymer chain.

Monomers containing halogens such as chlorine, bromine and fluorine may be used as compounds which react with the block copolymer having stable anionic terminal groups to form terminal groups having radical-polymerizable double bonds. Specific examples of these halogen-containing monomers include haloalkyl vinyl ethers such as 1-chloroethyl vinyl ether and 3-chloropropyl vinyl ether; halogen-containing vinyl esters such as vinyl chloroacetate, vinyl 2-chloropropionate and vinyl 2-bromoundecanoate; diene halides such as 2-chloromethyl-1,3-butadiene and 2-chloromethyl-3-methyl-1,3-butadiene; (meth)acryloyl halides such as acryloyl chloride and methacryloyl chloride; and other halogen-containing monomers such as vinyl benzyl chloride, cinnamoyl chloride, N-chloromethyl-$\alpha$-phenylmaleimide, bromonorbornene and bromomethylnorbornene. Such a compound is bonded to one terminal when a monofunctional polymerization initiator is used at the time of producing the block copolymer, and to both terminals when a difunctional polymerization initiator is used.

The block copolymer used in this invention has a radical-polymerizable terminal group as stated above. Hence, when a flexographic plate is produced from a mixture of this block copolymer, a radical-polymerizable monomer and a photopolymerization initiator and exposed to light, crosslinkage occurs between the molecular chains of the block copolymer. As a result, the strength of the flexographic plate after exposure is improved and the reproducibility of a relief image can be greatly improved.

The content of the elastomer (a) or (b) in the photosensitive elastomeric composition of this invention is usually not less than 30% by weight. In view of rubbery elasticity or the ease of molding, it is preferably used in a proportion of 60 to 95% by weight. As required, another elastomeric polymer may be used in combination so long as its use does not depart from the scope and spirit of the present invention.

The addition-polymerizable compound (2) and the polymerization initiator (3) activatable by actinic light used in the photosensitive elastomeric composition of this invention may be any of those which have heretofore been used for producing photosensitive elastomeric compositions.

Examples of the addition-polymerizable compound (2) having at least one $CH_2=C<$ group include diacrylates and dimethacrylates of ethylene glycol, diethylene glycol, propylene glycol, dipropylene glycol, polyethylene glycol, polypropylene glycol, 1,4-butanediol and 1,6-hexanediol, trimethylolpropane triacrylate or trimethacrylate, pentaerythritol tetraacrylate or tetramethacrylate, N,N'-hexamethylenebisacrylamide and methacrylamide, diacetone acrylamide or methacrylamide, styrene, vinyltoluene, divinylbenzene, diallyl phthalate, and triallyl cyanurate. They may be used singly or in combination. The amount of the compound (2) is usually 5 to 30% by weight based on the weight of the photosensitive composition (the same basis hereinafter).

Examples of the polymerization initiator (3) activatable by actinic light include benzophenone, benzoin, benzoin alkyl ethers (such as benzoin methyl, ethyl, isopropyl or isobutyl ether), alpha-methylbenzoin, alpha-methylbenzoin methyl ether, alpha-methoxybenzoin methyl ether, benzoin phenyl ether, alpha-t-butylbenzoin, anthraquinone, benzanthraquinone, 2-ethylanthraquinone, 2-chloroanthraquinone, 2-2'-dimethoxydiphenyl acetophenone, 2,2-diethoxyphenyl acetophenone, 2,2-diethoxyacetophenone, benzil, and pivaloin. They may be used either singly or in combination. The amount of the initiator (3) is usually 0.01 to 5% by weight.

Components other than the above may be incorporated in the photosensitive composition as required. Examples of such components are additives, thermal polymerization inhibitor and antioxidants.

The additives aid in the production and molding of the photosensitive elastomeric composition, promote removal of unexposed portions of the photosensitive elastomer composition, and further adjust the hardness of the exposed hardened portions. Such additives may be used in an amount of 2 to 40% by weight according to the desired characteristics. Specific examples of the additives include hydrocarbon oils such as naphthenic oil or paraffinic oil, low-molecular-weight polystyrene (molecular weight not more than 3,000), alpha-methylstyrene/vinyltoluene copolymer, petroleum resins, polyacrylate, polyethylene, polyestes, polyterpene resins, liquid 1,2- and 1,4-polybutadienes, hydroxides of these, carboxylated products of these, liquid acrylonitrile/butadiene copolymer and a carboxylated product thereof, and liquid styrene/butadiene copolymer.

Examples of the thermal polymerization inhibitor include 2,6-di-t-butyl-4-methylphenol, methoxyphenol, 2,6-di-t-butyl-p-cresol, t-butylcatechol, pyrogallol, naphthylamine, beta-naphthol, t-butylhydroxyanisole, and hydroquinone. The amount of the thermal polymerization inhibitor is usually 0.001 to 2% by weight.

The photosensitive elastomeric composition may be prepared by many methods. For example, the ingredients may be mixed and kneaded by a kneader or a roll mill which is an ordinary rubber compounding machine. The mixture may be formed into a sheet of a desired thickness by using a molding machine such as an extruder, a press or a calender. If desired, it is also possible to dissolve the photosensitive elastomer composition of this invention in a suitable solvent such as chloroform, carbon tetrachloride, 1,1,1-trichloroethane, trichloroethylene, tetrachloroethylene, methyl ethyl ketone, diethyl ketone, methyl isobutyl ketone, benzene, toluene or tetrahydrofuran, pour the resulting solution into a mold, and evaporate the solvent thereby forming a sheet. A sheet having a good thickness accuracy may be prepared by treating the resulting sheet by hot pressing, extrusion or calendering.

To prevent contamination or damage of the photosensitive layer during storage or operation, a strippable thin transparent film layer of polyethylene, polypropylene, polyester, polystyrene, etc. may be formed on the surface of the photosensitive layer of the photosensitive elastomeric composition molded in sheet form.

A solvent-soluble thin flexible layer may be formed on the sheet-like photosensitive elastomeric composition of this invention in order to improve contact of the sheet with an image-bearing transparency and enable its re-use after irradiating actinic light. Preferably, when after the exposure of the photosensitive layer, the unexposed portions are washed with a solvent, this flexible layer is removed simultaneously.

When the photosensitive elastomeric composition of this invention is used, shrinkage is prevented during molding of a photosensitive flexographic original plate and the resulting flexographic plate has very good surface smoothness. Hence, a relief image having a high resolution can be obtained by exposing the original plate to actinic light, and removing the unexposed portions. Furthermore, as a result of using the composition of this invention, the resulting flexographic plate has high rubbery elasticity.

The photosensitive elastomeric composition of this invention finds excellent utility in the preparation of a flexographic printing plate. It may also be used for photoresists, screens for screen printing, paints, coating materials, adhesives, films, sheet-like materials, impregnated materials and other molded articles.

The following examples illustrate the present invention more specifically. Unless otherwise specified, all parts and percentages in the following examples are by weight.

ELASTOMER PRODUCTION EXAMPLE 1

In each run, a styrene/butadiene/polyene elastomeric copolymer was prepared in accordance with the polymerization recipe shown in Table 1 by emulsion polymerization at 5° C. in a pressure vessel.

When the polymerization conversion reached 65±5%, 0.5 part of sodium dimethyldithiocarbamate was added to stop the polymerization.

TABLE 1

| Polymerization recipe | Polymer No. | | | | | | | |
| --- | --- | --- | --- | --- | --- | --- | --- | --- |
|  | (1) | (2) | (3) | (4) | (5) | (6) | (7) | (8) |
| Deionized water | 200 | 200 | 200 | 200 | 200 | 200 | 200 | 200 |
| Potassium oleate | 3 | 3 | 3 | 3 | 3 | 3 | 3 | 3 |
| Styrene | 28 | 28 | 28 | 28 | 28 | 28 | 28 | 28 |
| Butadiene | 72 | 72 | 72 | 72 | 72 | 72 | 72 | 72 |
| Sodium triphosphate dihydrate | 0.8 | 0.8 | 0.8 | 0.8 | 0.8 | 0.8 | 0.8 | 0.8 |
| Sodium formaldehyde sulfoxylate | 0.15 | 0.15 | 0.15 | 0.15 | 0.15 | 0.15 | 0.15 | 0.15 |
| $FeSO_4$—$7H_2O$ | 0.005 | 0.005 | 0.005 | 0.005 | 0.005 | 0.005 | 0.005 | 0.005 |
| Tetrasodium ethylenediaminetetraacetate | 0.07 | 0.07 | 0.07 | 0.07 | 0.07 | 0.07 | 0.07 | 0.07 |
| t-Dodecylmercaptan | 0.2 | 0.2 | 0.2 | 0.2 | 0.2 | 0.2 | 0.2 | 0.2 |
| p-Menthane hydroperoxide | 0.1 | 0.1 | 0.1 | 0.1 | 0.1 | 0.1 | 0.1 | 0.1 |
| Polyene monomer |  |  |  |  |  |  |  |  |
| Divinylbenzene | 0.5 | 2.0 | 5.0 | — | — | — | 11.5 | 0.01 |
| Ethylene glycol diacrylate | — | — | — | 2.0 | — | — | — | — |
| Trimethylolpropane trimethacrylate | — | — | — | — | 2.0 | — | — | — |

The resulting polymer emulsion was coagulated with aqueous sodium chloride solution and sulfuric acid in a customary manner. The coagulated product was washed with water and dried to give a styrene/butadiene/polyene elastomeric copolymer.

ELASTOMER PRODUCTION EXAMPLE 2

Elastomeric copolymers composed of acrylonitrile/butadiene (34/64%) [polymer No. (9)—divinylbenzene 0%; polymer No. (10)—divinylbenzene 2%)] were prepared in accordance with the same polymerization recipe and under the same polymerization conditions as in Elastomer Production Example 1 except that acrylonitrile was used instead of styrene, and divinylbenzene as the polyene monomer was used in an amount of 0% and 2%.

ELASTOMER PRODUCTION EXAMPLE 3

In each run, a butadiene/divinylbenzene elastomeric copolymer was prepared in accordance with the polymerization recipe shown in Table 2 in a pressure vessel at 60° C.

When the polymerization conversion reached 95%, 0.5 part of sodium dimethyldithiocarbamate was added. The pressure vessel was cooled with water to stop the reaction.

TABLE 2

| Polymerization recipe | Polymer No. (11) | Polymer No. (12) |
|---|---|---|
| Deionized water | 200 | 200 |
| Butadiene | 100 | 100 |
| Potassium oleate | 3.0 | 3.0 |
| t-Dodecylmercaptan | 0.2 | 0.2 |
| Potassium persulfate | 0.3 | 0.3 |
| Potassium chloride | 0.5 | 0.5 |
| Dispersant (1) | 0.2 | 0.2 |
| Divinylbenzene | — | 2.0 |

Note:
(1) Formaldehyde condensate of sodium naphthalenesulfonate.

The resulting polymer emulsion was coagulated with an aqueous sodium chloride solution and sulfuric acid in a customary manner. The coagulated product was washed with water and dried to give a butadiene/divinylbenzene elastomeric copolymer.

ELASTOMER PRODUCTION EXAMPLE 4

In a 5-liter pressure reactor, 112.5 g of styrene was first polymerized at 30° C. for 1 hour in the presence of 1.875 kg of a mixed solvent of n-butane and cyclohexane in a ratio of 30:70, 20 millimoles of dibutyl ether and 10 millimoles of n-butyllithium as an initiator. Subsequently, 687.5 g of isoprene was added and polymerized for 1.5 hours while the reaction temperature was adjusted to 50° to 60° C. by using a reflux condenser. Then, to convert the active terminals of the isoprene block into stable anions, 11 millimoles of ethylene oxide and further 12 millimoles of acryloyl chloride were added and reacted with the terminals of the active polymer. Methanol (5 ml) as a reaction stopper and 4 g of 4-methyl-2,6-di-t-butylphenol as an oxidation stabilizer were added to the reaction mixture. The mixed solution was then added dropwise little by little to water heated at 85° to 95° C. to volatilize the solvent. The resulting polymer was pelletized and dried in hot air at 85° C. Thus, a block copolymer having a radical-polymerizable terminal group was obtained.

EXAMPLE 1

In each run, a photosensitive elastomeric composition was prepared using each of the elastomers prepared in Elastomer Production Examples 1 to 3. As a comparison, a composition comprising a commercial thermoplastic elastomer was prepared.

Specifically, the photosensitive elastomer composition was produced by kneading 100 parts of the elastomer, 10 parts of liquid polybutadiene (Nisso PB B-1000, a product of Nippon Soda Co., Ltd.) and 2 parts of 2,6-di-t-butyl-p-cresol in a kneader at 150° C., lowering the kneading temperature to 110° C. when a uniform mixture was obtained, adding 5 parts of 1,4-butanediol diacrylate, 5 parts of hexanediol dimethacrylate, 0.02 part of methylhydroquinone and 0.8 part of benzoin isopropyl ether. The composition was evaluated by the following testing methods.

Shrinkage of a sheet

The composition was again kneaded by a roll, and by the method of ASTM D1917-79, the shrinking state of the sheet at room temperature was measured. The shrinkage of the sheet was calculated from the following equation.

$$\text{Shrinkage}(\%) = [(C-L)/C] \times 100$$

wherein

C is the circumference (cm) of the roll, and
L is the length (cm) of the sample sheet after the sample sheet taken out from the roll was left to stand at room temperature for 24 hours.

Larger shrinkage values show greater shrinkage and the sheet-forming property of the composition is inferior.

Smoothness of the sheet

The surface state of the sheet used in the above test for shrinkage was observed with the naked eye, and evaluated on the following standard.

Rating

⊙: The surface was very smooth.
○: Fine raised and depressed patterns were slightly observed on the surface.
Δ: Fine raised and depressed patterns were observed on the surface.
X: Very wavy raised and depressed patterns were observed on the surface.
XX: Sheet formation was difficult.

Evaluation of a relief image

The composition was again kneaded to form a sheet having a thickness of 3.3 mm. This sheet was held by polyester films having a thickness of 100 microns and placed inwardly of spacers having a thickness of 3 mm. The assembly was pressed at 120° C. to prepare a photosensitive flexographic original plate. An image-bearing transparency was brought into intimate contact with one surface of the plate. By using an exposing machine (Model JE-A3-SS made by Nippon Denshi Seiki K. K.) fitted with a 200W ultraviolet fluorescent lamp, actinic light was irradiated for 1 minute from that surface of the plate with which the transparency was not in contact. The polyester film on the irradiated surface was stripped off, and actinic light was irradiated for 10 minutes through the transparency from above that surface to which the transparency was kept in intimate contact. After the end of exposure, the transparency was stripped off, and the unexposed portions were dissolved with a mixture of 1,1,1-trichloroethane/isopropanol (3/1) by means of a brush. The plate was dried in a hot air dryer at 60° C. for 30 minutes to form a relief image. The relief image was evaluated by the following standard.

| Rating | State of the relief image |
|---|---|
| 5 | A relief in which even fine lines have a clear contour. |
| 4 | A relief in which curving of fine lines is slightly observed. |
| 3 | A relief in which curving of fine lines is observed. |
| 2 | A relief in which fine lines are difficult to form. |
| 1 | A relief which is evidently inferior. |

Change in hardness

Hardness was measured on a planar portion of the sample used in forming a relief image. In accordance with the Method of Testing Hardness in JIS K-6301, a pressing needle was brought into contact with a measuring surface of the sample and immediately then, the scale was read and defined as the initial value of hardness. While the press needle was kept in contact with the sample for 10 seconds, the scale was read. The change in hardness was calculated from the following equation.

Change in hardness = (initial value) − (the value measured 10 seconds later)

Small values of the change in hardness show higher rubbery elasticity.

The results of evaluation are shown in Table 3.

It is seen from the results given in Table 3 that the photosensitive elastomeric compositions of this invention have improved sheet-forming properties and rubbery elasticity over conventional compositions, and give relief images of a high resolution.

The use of the composition containing polymer No. 7 gave only a heavily raised and depressed sheet, and could not be evaluated. The results obtained when polymer No. 8 was used were much the same as those obtained when polymer No. 6 was used.

The sheet-forming properties of this composition were evaluated as in Example 1.

Then, the resulting photosensitive composition was interposed between polyester films having a thickness of 0.1 mm, and the assembly was molded into a sheet having a thickness of 3 mm by a vacuum press. The films were stripped off. A negative film was applied to the surface of the sheet, and light from an ultraviolet fluorescent lamp was irradiated on the surface of the negative film for 3 to 6 minutes After exposure, the photosensitive original plate was washed with a trichloroethane solution to obtain a relief image (relief height 1.4 mm). The rubbery elasticity and resolution of the resulting plate were evaluated as in Example 1. The results are shown in Table 4. For comparison, a commercial flexographic plate Cyrel (made by du Pont) was used.

The tensile strength and elongation of the plate after exposure were measured in accordance with JIS K-6301, and found to be 150 kg/cm$^2$ and 1,000%. In the comparison, they were respectively 80 kg/cm$^2$, and 300%.

TABLE 4

| Run No. | Invention 12 | Comparison 13 |
|---|---|---|
| Sheet-forming properties | | |
| Surface smoothness | ⊚ | ⊚ |
| Sheet shrinkage | 9.8 | 10.7 |
| Rubbery elasticity | | |
| Change in hardness | 1 | 3 |
| Relief image property | | |
| Resolution | 5 | 3 |

The relief image obtained by using the composition of this invention was photographed, and the reproducibility of halftone dots and fine lines was evaluated. The limit of reproduction of halftone dots and fine lines was much better in the present invention than in the case of the commercial plate, and the relief image was sharp and had high accuracy. The relief height on the commercial plate in the comparison was higher than in the present invention, and the relief was greatly swollen with the solvent during the development.

TABLE 3

| Run No. | Invention | | | | | | | Comparison | | | |
|---|---|---|---|---|---|---|---|---|---|---|---|
| | 1 | 2 | 3 | 4 | 5 | 6 | 7 | 8 | 9 | 10 | 11 |
| Polymer No. | (1) | (2) | (3) | (4) | (5) | (10) | (12) | (6) | (9) | (11) | (13) |
| Sheet-forming properties | | | | | | | | | | | |
| Surface smoothness | ⊚ | ⊚ | ⊚ | ⊚ | ⊚ | ⊚ | ○ | X | X | X | ⊚ |
| Sheet shrinkage | 10.5 | 7.8 | 3.2 | 6.8 | 5.4 | 6.5 | 11.1 | 48.2 | 54.5 | 17.8 | 10.5 |
| Rubbery elasticity | | | | | | | | | | | |
| Change in hardness | 2 | 1 | 1 | 1 | 1 | 1 | 1 | 8 | 2 | 10 | 3 |
| Relief image property | | | | | | | | | | | |
| Resolution | 4 | 5 | 5 | 5 | 5 | 5 | 4 | 1 | 2 | 1 | 4 |

Note:
Polymer No. 13 is Kraton 1107 (a tradename for A-B-A type block copolymer made by Shell Chemical Co.).

EXAMPLE 2

One hundred grams of the block copolymer obtained in Elastomer Production Example 4 was mixed fully with 0.6 g of benzoin methyl ether, 5 g of 1,4-butanediol dimethacrylate and 0.01 g of 2,6-di-t-butyl-4-methylphenol as in Example 1 to prepare a photosensitive composition (this invention).

EXAMPLE 3

In the same way, block copolymers in which the terminal groups shown in Table 5 were present were prepared as in Example 2 and in accordance with the same recipe as in Example 2, photosensitive compositions were prepared. The sheet-forming properties of the compositions and the change in hardness of the cured product and the resolution of the flexographic plates were evaluated, and the results are shown in Table 5.

TABLE 5

| Run No. | Terminal group | Sheet-forming properties | | Rubbery elasticity | Relief image property |
| --- | --- | --- | --- | --- | --- |
| | | Surface smoothness | Shrinkage of the sheet | Change in hardness | Resolution |
| Invention | | | | | |
| 14 | $-\overset{\overset{O}{\|}}{C}-CH=CH_2$ | ◉ | 10.1 | 2 | 5 |
| 15 | $-\overset{\overset{O}{\|}}{C}-\overset{\overset{CH_3}{\|}}{C}=CH_2$ | ◉ | 10.3 | 1 | 5 |
| 16 | $-\overset{\overset{O}{\|}}{C}-CH=CH-\text{C}_6\text{H}_5$ | ◉ | 9.5 | 1 | 5 |
| 17 | $-CH_2-N$ (phenyl maleimide group) | ◉ | 8.6 | 1 | 4 |
| 18 | Cynamylidene group | ◉ | 9.1 | 1 | 4 |

EXAMPLE 4

In the same way as in Example 2, block copolymers in which terminal groups having a radical-copolymerizable double bond described in Table 6 (using acryloyl chloride as a source of the terminal groups) were prepared. In accordance with the same recipes as in Example 2, cured products and flexographic plates were prepared. The sheet-forming properties, changes in hardness and resolutions were evaluated. The results are shown in Table 6.

TABLE 6

| | | Block copolymer | | | Evaluation | | | |
| --- | --- | --- | --- | --- | --- | --- | --- | --- |
| | | | | | Sheet-forming properties | | Rubbery elasticity | Relief image property |
| Run No. | Polymer No. | Composition of A-B (*1) | Proportion of A (%) | Molecular weight (*2) | Surface smoothness | Shrinkage of the sheet | Change in hardness | Resolution |
| Invention | | | | | | | | |
| 19 | 1 | S-I | 16 | $1.3 \times 10^5$ | ○ | 10.6 | 2 | 5 |
| 20 | 2 | S-I | 16 | $2.3 \times 10^5$ | ◉ | 9.5 | 2 | 5 |
| 21 | 3 | S-I | 16 | $4.0 \times 10^5$ | ◉ | 9.3 | 1 | 5 |
| 22 | 4 | S-I | 8 | $2.3 \times 10^5$ | ○ | 10.7 | 1 | 4 |
| 23 | 5 | S-I | 20 | $2.3 \times 10^5$ | ◉ | 10.2 | 2 | 5 |
| 24 | 6 | S-B | 16 | $3.0 \times 10^5$ | ◉ | 10.8 | 1 | 4 |
| 25 | 7 | MS-I | 16 | $2.6 \times 10^5$ | ◉ | 9.1 | 1 | 5 |
| 26 | 8 | MS-B | 16 | $2.9 \times 10^5$ | ◉ | 9.6 | 1 | 4 |
| 27 | 9 | (S-I)$_2$ | 16 | $2.6 \times 10^5$ | ◉ | 6.8 | 1 | 5 |
| 28 | 10 | (S-I)$_3$ | 16 | $3.9 \times 10^5$ | ◉ | 6.4 | 2 | 5 |
| 29 | 11 | (S-I)$_4$ | 16 | $5.2 \times 10^5$ | ◉ | 5.2 | 2 | 5 |

(*1): S represents polystyrene; I, polyisoprene; B, polybutadiene; and MS, poly-α-methylstyrene.
(*2): Weight average molecular weight measured by GPC.

What we claim is:

1. An organic solvent-soluble photosensitive elastomeric composition comprising (1) at least one elastomer, (2) an addition-polymerizable compound having at least one $CH_2=C<$ group and (3) a polymerization initiator activatable by actinic light, wherein the elastomer (1) is an elastomeric copolymer consisting of 40 to 100% by weight of a conjugated diene-type monomer, 60 to 0% by weight of a copolymerizable vinyl monomer selected from the group consisting of aromatic vinyl monomers and unsaturated nitrile monomers, and 0.05 to 5% of weight, based on the total weight of said two monomers, of a polyene monomer containing at least two non-conjugated double bonds.

2. The composition of claim 1 wherein the polyene monomer is a compound containing 2 or 3 ethylenically unsaturated bonds per molecule.

3. The composition of claim 1 wherein the conjugated diene-type monomer comprises 1,3-butadiene, isoprene, 2,3-dimethyl butadiene, 1,3-pentadiene or chloroprene.

4. The composition of claim 1 wherein the elastomeric copolymer is composed of each of the conjugated diene-type monomer, the copolymerizable vinyl monomer and the polyene monomer, and wherein said copolymerizable vinyl monomer comprises styrene, alpha-methyl styrene, acrylonitrile, methacrylonitrile or alpha-chloroacrylonitrile.

5. The composition of claim 1 wherein the polyene monomer is at least one monomer selected from the group consisting of divinylbenzene, divinyl sulfide, divinylsulfone, divinyl oxalate, N,N'-methylenebisacrylamide, allyl acrylate, allyl methacrylate, vinyl acrylate, vinyl methacrylate, allyl vinyl ether, allyl acrylamide, allyl methacrylamide, diallyl acrylamide, diallyl ether, diallyl oxalate, diallyl malonate, diallyl adipate, trimethylolpropane triallyl ether, ethylene glycol diacrylate, ethylene glycol dimethacrylate, polyethylene glycol diacrylate, propylene glycol diacrylate, bisphenol dimethacrylate and trimethylolpropane trimethyacrylate.

6. The composition of claim 1 wherein the amount of the polyene monomer is from 0.1 to 3% by weight based on the total weight of said conjugated diene-type monomer and said copolymerizable vinyl monomer.

7. The composition of claim 1 comprising more than 30% by weight of said at least one elastomer.

8. The composition of claim 1 which comprises from about 60 to 95% by weight of the at least one elastomer.

9. The composition of claim 1 wherein the at least one elastomer comprises a styrene/butadiene/polyene elastomeric copolymer.

10. The composition of claim 9 wherein said polyene is divinylbenzene, ethylene glycol diacrylate or trimethylolpropane trimethacrylate.

11. The composition of claim 9 wherein the polyene is divinylbenzene.

12. The composition of claim 1 wherein the conjugated diene-type monomer comprises butadiene and the polyene comprises divinylbenzene.

13. The composition of claim 12 wherein the elastomeric copolymer further comprises acrylonitrile as the copolymerizable vinyl monomer.

14. A flexographic printing plate possessing a photopolymerizable layer on a base, wherein the photopolymerizable layer comprises the photosensitive elastomeric composition of claim 1.

15. The composition of claim 1 wherein the addition-polymerizable compound is selected from the group consisting of: diacrylates and dimethacrylates of ethylene glycol, diethylene glycol, propylene glycol, dipropylene glycol, polyethylene glycol, polypropylene glycol, 1,4-butanediol and 1,6-hexanediol; trimethylolpropane triacrylate; trimethylolpropane trimethacrylate; pentaerythritol tetraacrylate; pentaerythritol tetramethacrylate; N,N'-hexamethylenebisacrylamide; N,N'-hexamethylenebismethacrylate; diacetone acrylamide; diacetone methacrylamide; styrene; vinyltoluene; divinylbenzene; diallyl phthalate; and triallyl cyanurate.

* * * * *